(12) United States Patent
Sun et al.

(10) Patent No.: US 7,808,004 B2
(45) Date of Patent: Oct. 5, 2010

(54) LIGHT EMITTING DIODE PACKAGE STRUCTURE AND METHOD OF MANUFACTURING THE SAME

(75) Inventors: Tsung-Ting Sun, Chung-Ho (TW); Hung-Ta Laio, Chung-Ho (TW); Hung-Hsun Chou, Chung-Ho (TW); Tz-Shiuan Yan, Chung-Ho (TW); Kuo-Shih Hsu, Chung-Ho (TW)

(73) Assignee: Edison Opto Corporation, Taipei (TW)

( * ) Notice: Subject to any disclaimer, the term of this patent is extended or adjusted under 35 U.S.C. 154(b) by 852 days.

(21) Appl. No.: 11/377,444

(22) Filed: Mar. 17, 2006

(65) Prior Publication Data

US 2007/0215896 A1    Sep. 20, 2007

(51) Int. Cl.
  *H01L 27/15* (2006.01)
(52) U.S. Cl. .................. 257/79; 257/419; 257/659; 257/698; 257/704; 257/E23.194; 257/E29.324; 257/E23.174; 257/E23.181; 257/E21.499; 257/113; 257/114; 257/E25.019; 257/E25.028; 257/E29.282; 257/E31.105; 257/E31.121; 257/E33.055
(58) Field of Classification Search .................. 257/59, 257/79, 749, 433, E33.059
See application file for complete search history.

(56) References Cited

U.S. PATENT DOCUMENTS

| | | | | |
|---|---|---|---|---|
| 3,192,536 A * | 7/1965 | Benner | ...................... | 2/418 |
| 4,701,999 A * | 10/1987 | Palmer | ...................... | 29/827 |
| 4,823,605 A * | 4/1989 | Stein | ...................... | 73/727 |
| 4,942,140 A * | 7/1990 | Ootsuki et al. | ................. | 29/827 |
| 5,218,759 A * | 6/1993 | Juskey et al. | ................... | 29/840 |
| 5,329,131 A * | 7/1994 | Wijdenes et al. | ............ | 250/551 |
| 5,434,105 A * | 7/1995 | Liou | ............................ | 29/827 |
| 5,570,272 A * | 10/1996 | Variot | ......................... | 361/723 |
| 5,663,106 A * | 9/1997 | Karavakis et al. | ............. | 29/841 |
| 5,687,270 A * | 11/1997 | Takizawa | ...................... | 385/94 |
| 5,863,810 A * | 1/1999 | Kaldenberg | ................... | 438/27 |
| 5,959,316 A * | 9/1999 | Lowery | ........................ | 257/98 |
| 5,981,312 A * | 11/1999 | Farquhar et al. | ............. | 438/112 |
| 6,081,997 A * | 7/2000 | Chia et al. | ..................... | 29/841 |
| 6,135,850 A * | 10/2000 | Reed | ........................... | 446/484 |
| 6,139,304 A * | 10/2000 | Centofante | ................... | 425/121 |
| 6,155,699 A * | 12/2000 | Miller et al. | ................. | 362/293 |
| 6,245,259 B1 * | 6/2001 | Hohn et al. | ............. | 252/301.36 |
| 6,254,815 B1 * | 7/2001 | Cheperak | ..................... | 264/135 |
| 6,480,389 B1 * | 11/2002 | Shie et al. | .................... | 361/707 |
| 6,541,800 B2 * | 4/2003 | Barnett et al. | .................. | 257/98 |
| 6,552,263 B2 * | 4/2003 | Farquhar et al. | ............. | 174/521 |
| 6,572,280 B2 * | 6/2003 | Hurt et al. | ..................... | 385/92 |

(Continued)

*Primary Examiner*—Fernando L Toledo
*Assistant Examiner*—Ankush K Singal
(74) *Attorney, Agent, or Firm*—Chun-Ming Shih; HDLS IPR Services

(57) ABSTRACT

A light emitting diode package structure having a heat-resistant cover and a method of manufacturing the same include a base, a light emitting diode chip, a plastic shell, and a packaging material. The plastic shell is in the shape of a bowl and has an injection hole thereon. After the light emitting diode chip is installed onto the base, the plastic shell is covered onto the base to fully and air-tightly seal the light emitting diode chip, and the packaging material is injected into the plastic shell through the injection hole until the plastic shell is filled up with the packaging material to form a packaging cover, and finally the plastic shell is removed to complete the LED package structure.

8 Claims, 6 Drawing Sheets

U.S. PATENT DOCUMENTS

| | | | |
|---|---|---|---|
| 6,617,786 B1* | 9/2003 | Centofante | 313/512 |
| 6,692,987 B2* | 2/2004 | Lim et al. | 438/106 |
| 6,733,711 B2* | 5/2004 | Durocher et al. | 264/272.14 |
| 6,734,465 B1* | 5/2004 | Taskar et al. | 257/80 |
| 6,751,327 B1* | 6/2004 | Urso et al. | 381/323 |
| 6,767,767 B2* | 7/2004 | Hayashida et al. | 438/124 |
| 6,826,336 B2* | 11/2004 | Guy | 385/49 |
| 6,922,024 B2* | 7/2005 | Yano et al. | 315/291 |
| 6,936,855 B1* | 8/2005 | Harrah | 257/88 |
| 7,029,935 B2* | 4/2006 | Negley et al. | 438/29 |
| 7,080,787 B2* | 7/2006 | Wulff et al. | 235/462.45 |
| 7,145,253 B1* | 12/2006 | Kim et al. | 257/790 |
| 7,213,945 B2* | 5/2007 | Yoneda et al. | 362/309 |
| 7,259,400 B1* | 8/2007 | Taskar | 257/98 |
| 7,264,378 B2* | 9/2007 | Loh | 362/294 |
| 7,276,739 B2* | 10/2007 | Chen et al. | 257/99 |
| 7,321,161 B2* | 1/2008 | Teixeira et al. | 257/675 |
| 7,326,583 B2* | 2/2008 | Andrews et al. | 438/26 |
| 7,498,610 B2* | 3/2009 | Kim et al. | 257/99 |
| 2001/0023087 A1* | 9/2001 | Brandl | 438/106 |
| 2001/0030866 A1* | 10/2001 | Hochstein | 362/294 |
| 2002/0076856 A1* | 6/2002 | Wensel | 438/122 |
| 2002/0163001 A1* | 11/2002 | Shaddock | 257/79 |
| 2003/0025117 A1* | 2/2003 | Isokawa et al. | 257/79 |
| 2003/0168720 A1* | 9/2003 | Kamada | 257/666 |
| 2003/0185005 A1* | 10/2003 | Sommers et al. | 362/240 |
| 2003/0211804 A1* | 11/2003 | Sorg | 445/24 |
| 2004/0008952 A1* | 1/2004 | Kragl | 385/88 |
| 2004/0079957 A1* | 4/2004 | Andrews et al. | 257/100 |
| 2004/0119086 A1* | 6/2004 | Yano et al. | 257/98 |
| 2004/0169466 A1* | 9/2004 | Suehiro et al. | 313/512 |
| 2004/0183081 A1* | 9/2004 | Shishov et al. | 257/79 |
| 2005/0202826 A1* | 9/2005 | Yuang | 455/450 |
| 2005/0224821 A1* | 10/2005 | Sakano et al. | 257/79 |
| 2005/0230691 A1* | 10/2005 | Amiotti et al. | 257/79 |
| 2005/0236638 A1* | 10/2005 | Tsukagoshi | 257/99 |
| 2005/0276438 A1* | 12/2005 | Kobayashi et al. | 381/433 |
| 2006/0186423 A1* | 8/2006 | Blonder et al. | 257/98 |
| 2006/0267041 A1* | 11/2006 | Lin et al. | 257/100 |
| 2006/0284185 A1* | 12/2006 | Kim et al. | 257/79 |
| 2007/0017294 A1* | 1/2007 | Asada et al. | 73/754 |
| 2007/0140624 A1* | 6/2007 | Wipiejewski | 385/88 |
| 2008/0268559 A1* | 10/2008 | Jung | 438/26 |

* cited by examiner

LIGHT EMITTING DIODE PACKAGE STRUCTURE AND METHOD OF MANUFACTURING THE SAME

BACKGROUND OF THE INVENTION

1. Field of the Invention

The present invention relates to a light emitting diode (LED), and more particular to a light emitting diode package structure and a method of manufacturing the same.

2. Description of Prior Art

A light emitting diode (LED) is a solid-state semiconductor device that combines two carriers produced by passing an electric current through the LED to release energy in the form of light. LED has the advantages of a compact size, a fast response rate, and a pollution-free feature, so that the LEDs can be used extensively in different industries. Since LEDs have bottlenecks including an insufficient brightness and a low luminous efficiency at an early stage, a high power LED is developed later to overcome the drawback of insufficient brightness, and thus LEDs become increasingly popular in the high power illumination market and tend to gradually take over the position of traditional tungsten lamps. LED products have the potential of replacing traditional illumination devices.

As LED manufacturing technologies are improved constantly and new materials are developed to meet the requirements of various different applications, the technology and structure of LEDs become mature, and thus leading to the development of a high power LED with enhanced energy capacity and brightness as well as the extensive use of high power LEDs in different areas. Among the types of high power LEDs, the surface mount device light emitting diode (SMD LED) is a common type of LEDs, and the general SMD LEDs are divided mainly into two types: a lead frame type and a printed circuit board type. The lead frame type uses a metal frame and a heat-resisting plastic material to produce a socket as a fixed lead frame of an LED chip by injection molding, and the printed circuit board type uses a composite material as a substrate, and both of these two types have to go through the processes of die bonding, wire bonding and encapsulation processes to complete the LED structure.

In a general die bonding process as shown in FIG. 1, a plastic shell 101 made of an insulating heat-resistant plastic material such as epoxy resin is covered onto an LED chip 102, and a packaging plastic material 103 such as soft silicone is injected into the plastic shell 101. Such arrangement not only prevents moisture or air from being permeated into the packaging plastic material during a non-airtight packaging process of the traditional packaging process, but also uses the plastic shell 101 for receiving the injected packaging plastic material 103 to form a fixed shape of the plastic shell 101, and thus the LED chip 102 can maximize its spectrum effect by the packaging plastic material 103 and the plastic shell 101.

However, there is a major drawback of the aforementioned packaging process, since the package structure and material cannot resist high temperature, and particularly the light emitting diode and other circuit board have to be processed in a soldering pot (at 250° C.~300° C.), and the plastic shell 101 and the soft plastic material 103 usually cannot stand the high temperature of the soldering pot, and the light emitting diode structure may have broken lines or the plastic shell 101 may become soft. Even if the plastic shell 101 and the soft plastic material 103 can resist the high temperature, the coefficients of thermal expansion of the plastic shell 101 and the soft plastic material 103 are different, and cracks may be produced between the packaging plastic shell 101 and the soft plastic material 103, and thus resulting a defective light emitting diode. To reduce the defects in a manufacturing process, the soldering is conducted manually, and thus making the manufacture more difficult and time-consuming.

SUMMARY OF THE INVENTION

In view of the foregoing shortcomings of the prior art, the inventor of the present invention based on years of experience in the related industry to conduct experiments and modifications, and finally designed a light emitting diode package structure and a method of manufacturing the same to overcome the shortcomings of the prior art structure.

The present invention is to provide a light emitting diode package structure with a heat-resisting cover and a method of manufacturing the same that adopts a heat-resistant packaging material capable of contacting air directly as a packaging cover material to improve the yield rate for the process of connecting other electronic components at a high temperature and overcome the problem of having cracks produced by the thermal expansion of traditional packaging housing and packaging material.

Accordingly, the present invention provides a light emitting diode packaging structure and a method of manufacturing the same that comprise a base, an LED chip, a plastic shell, and a packaging material, wherein the plastic shell is substantially in the shape of a bowl, and the plastic shell has an injection hole thereon. After the LED chip is installed on the base, the packaging plastic shell is covered onto the base, and the LED chip is fully and air-tightly sealed. A packaging material is injected into the plastic shell through the injection hole until the plastic shell is filled up with the packaging material to form a packaging cover, and finally the packaging plastic shell is removed to complete the LED package structure.

BRIEF DESCRIPTION OF DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

The technical characteristics, features and advantages of the present invention will become apparent in the following detailed description of the preferred embodiments with reference to the accompanying drawings.

Figure 1:
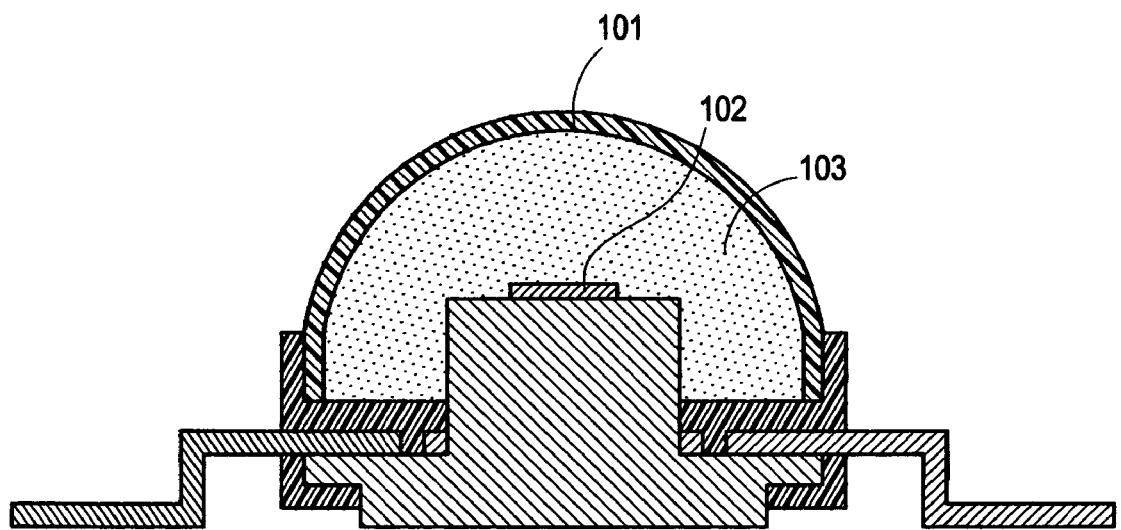
FIG. 1 is a cross-sectional view of a prior art light emitting diode.
Figure 2:
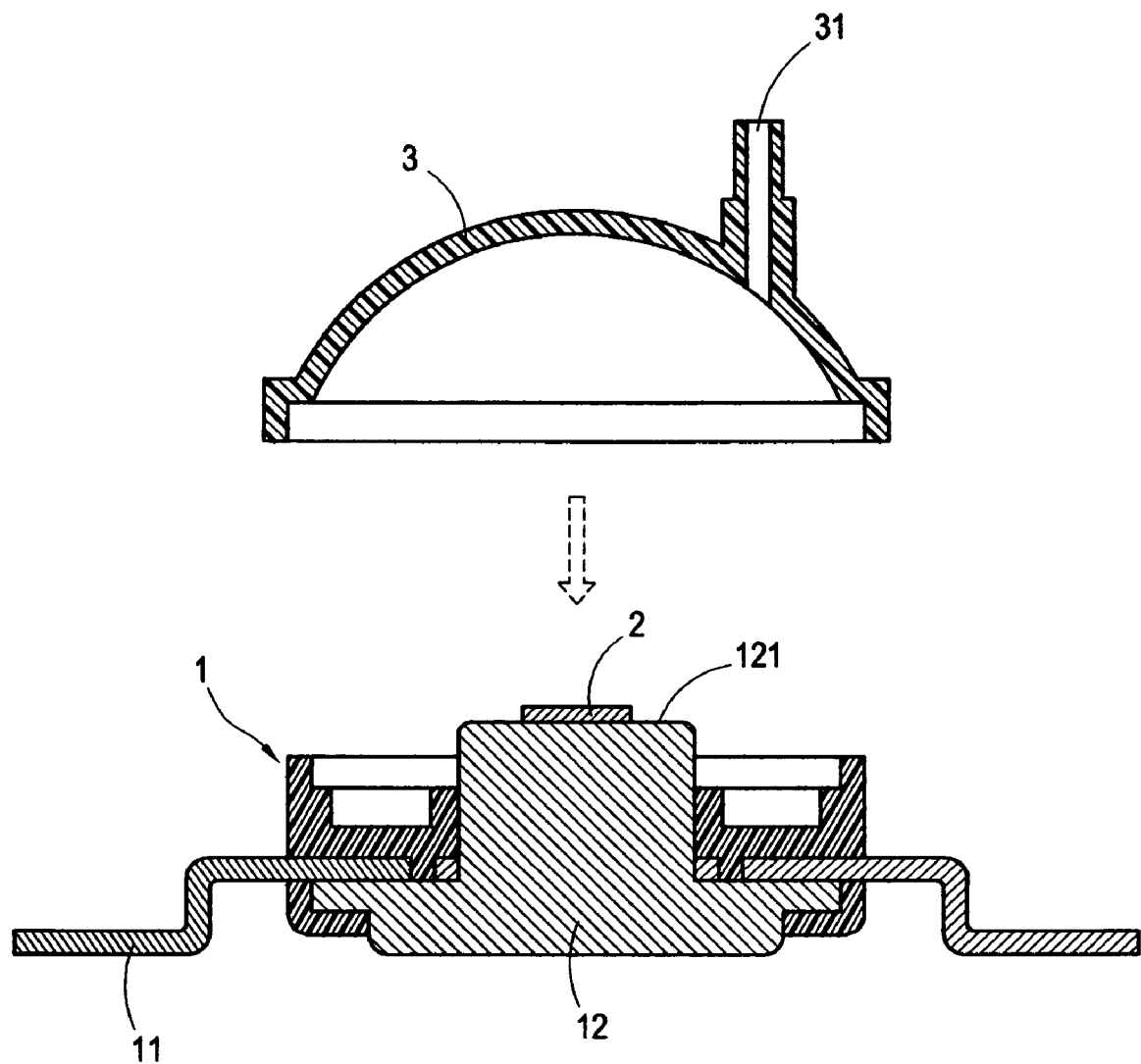
FIG. 2 is a cross-sectional view of an LED packaging process of the invention.
Figure 3:
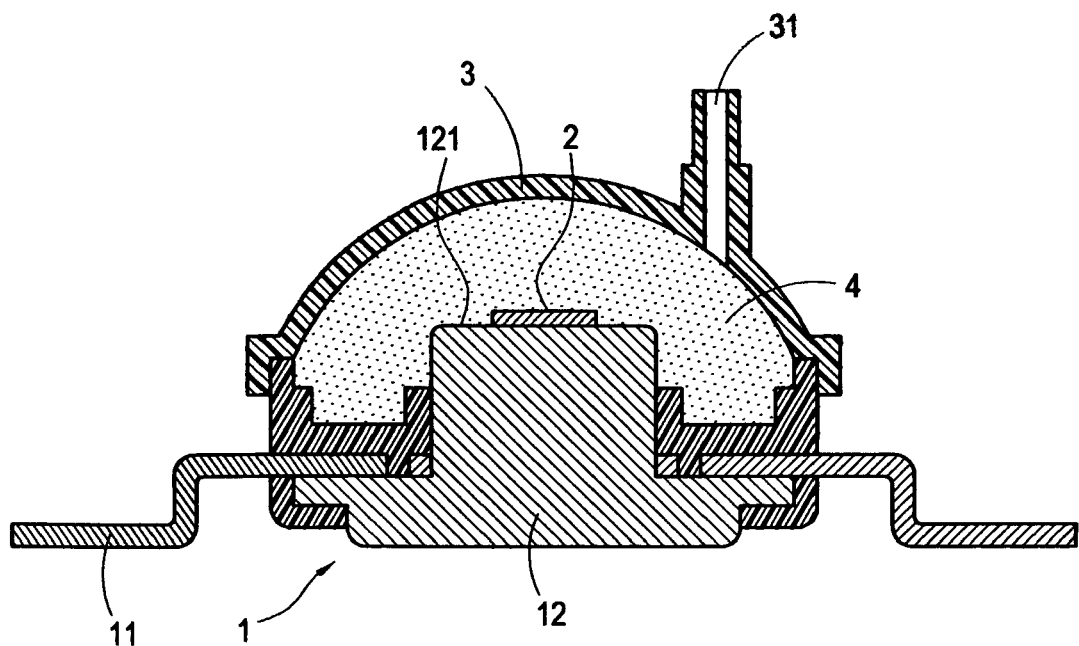
FIG. 3 is another cross-sectional view of an LED packaging process of the invention.
Figure 4:
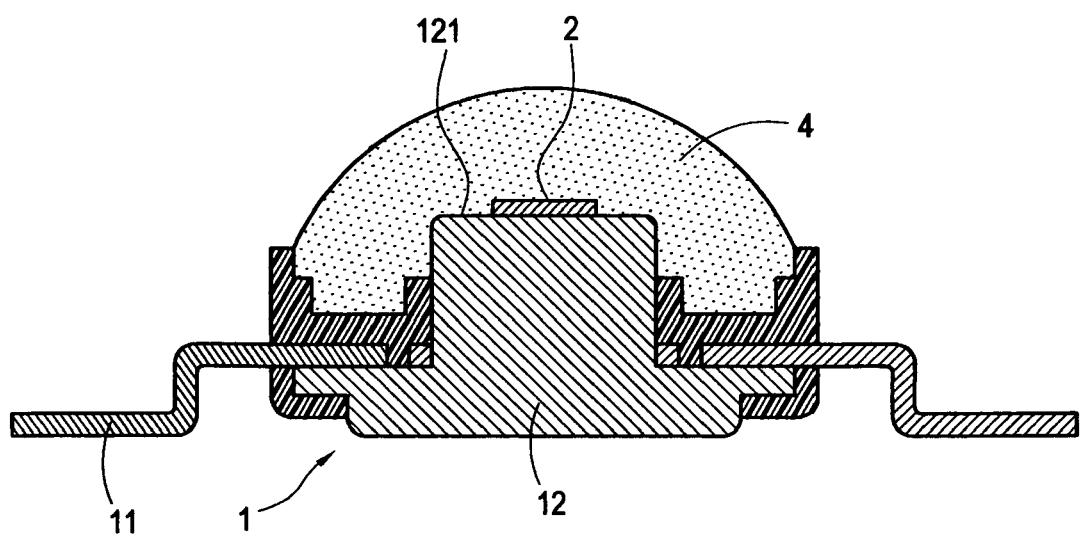
FIG. 4 is a further cross-sectional view of an LED packaging process of the invention.

Referring to FIGS. 2 to 4 for the cross-sectional views of an LED packaging process according to a preferred embodiment of the present invention, the structure of an LED packaging process as shown in FIG. 2 comprises a light emitting diode having a base 1, an LED chip 2, a packaging plastic shell 3, and a packaging material 4 (as shown in FIG. 3). The base 1 of the light emitting diode in this preferred embodiment is a semi-finished product of a lead frame type LED, and the base 1 further includes a lead frame 11 for an electric connection and a heat dissipating member 12, and then the semi-finished product is processed through a heat-resistant plastic molding injection and formation. The heat dissipating member 12 in the base 1 has a plane 121 of the LED chip 2, and the plane 121 fixes the LED chip 2, and the plastic shell 3 is in a hemispherical shape for covering the base 1 and sealing the LED chip 2 in the plastic shell 3, and the plastic shell 3 has an injection hole 31 disposed on a lateral side of the plastic shell 3.

Figure 5:
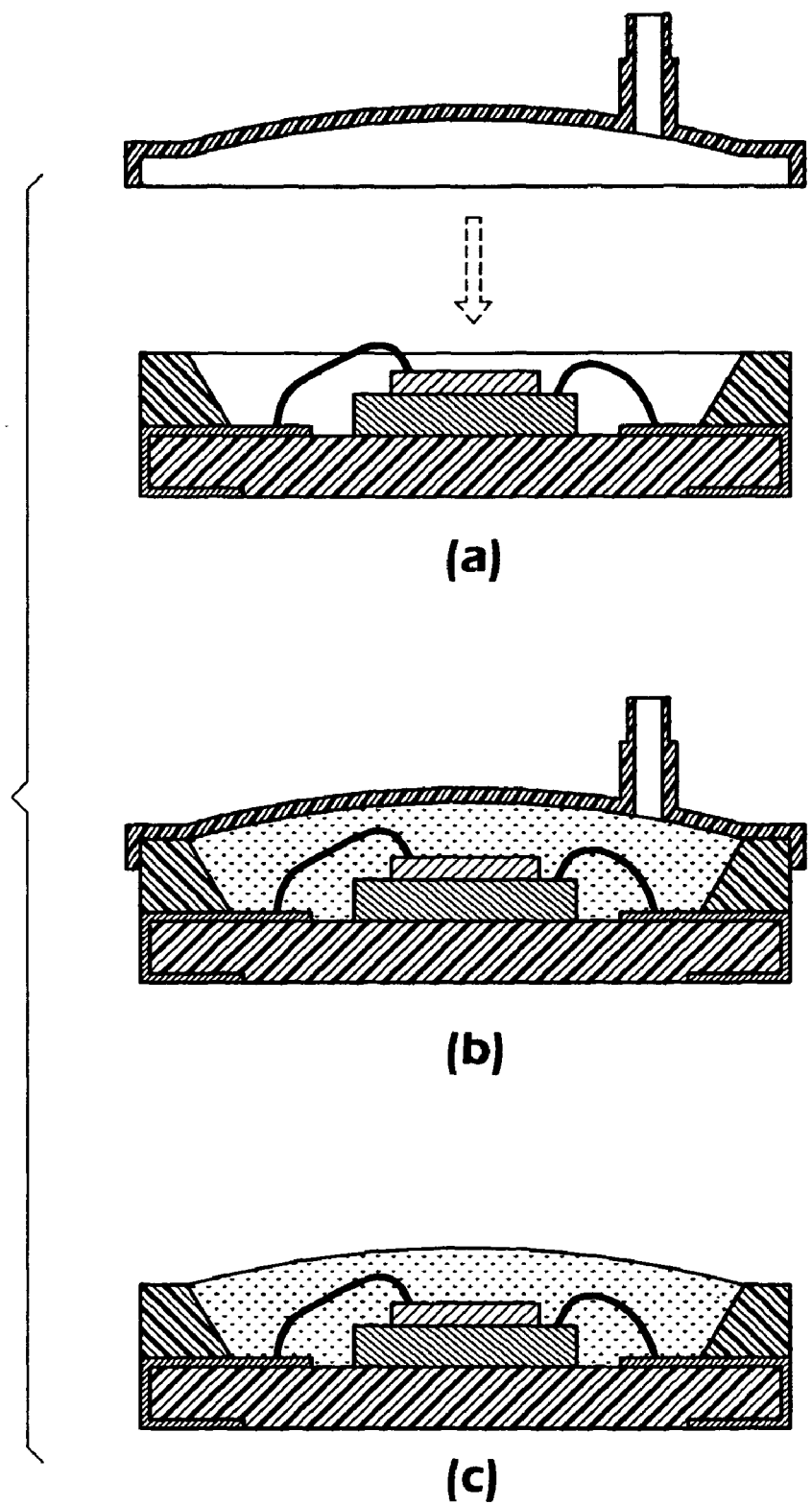
FIGS. 5(*a*) to 5(*c*) are schematic view of a manufacturing procedure according to another preferred embodiment of the invention.
Figure 6:
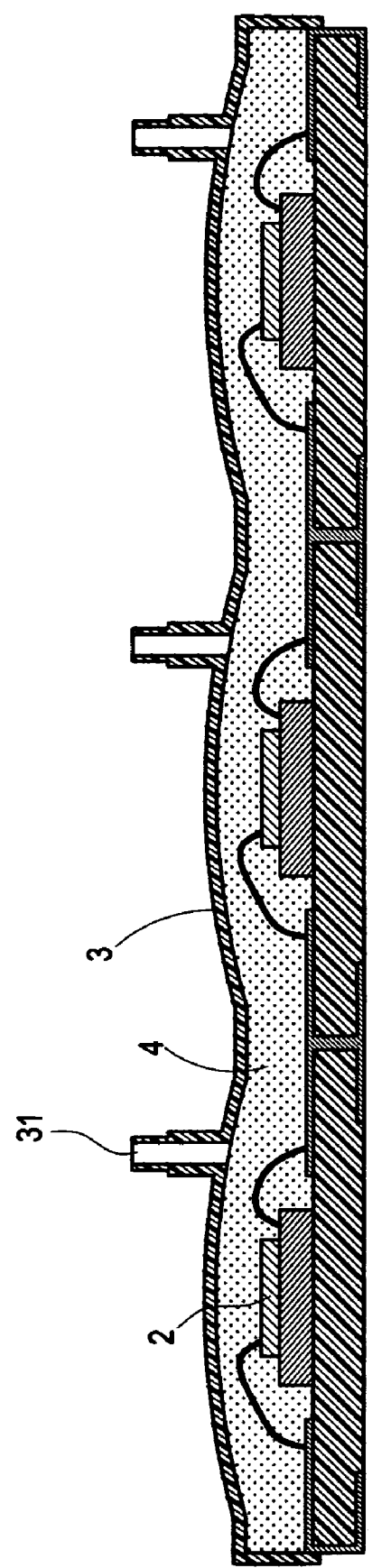
FIG. 6 is a schematic view of a further preferred embodiment of the invention.

In FIG. 3, the plastic shell 3 is installed onto the base 1 to fully seal the space around the periphery of the LED chip 2 which is preinstalled on the base 1, and the packaging material 4 is injected into the plastic shell 3 from the injection hole 31. The packaging material 4 of this preferred embodiment is a silicone material having a hardness that falls within the range from shore A40 to shore D70, and thus after the packaging material 4 is injected from the injection hole 31 until the plastic shell 3 is filled up to form a hemispherical cover and fully cover the LED chip 2 as shown in FIG. 4. After the packaging material 4 is solidified and shaped, the mold of the plastic shell 3 covered on the external portion of the packaging material 4 is released and removed to complete the LED package structure, so that when the light emitting diode structure and other printed circuit board pass through a soldering pot in a connecting process, the light emitting diode structure and printed circuit board can resist the high temperature to successfully complete the connection. Further, the foregoing process can also be used in a printed circuit board type LED package structure as shown in FIGS. 5(a) to 5(c). Referring to FIG. 6, the plastic shell 3 having a plurality of injection holes 31 is covered onto a semi-finished substrate having a plurality of manufactured LED chips 2, and injected with a packaging material 4, and finally the mold of the plastic shell 3 is removed to complete the package structure.

Figure 7:
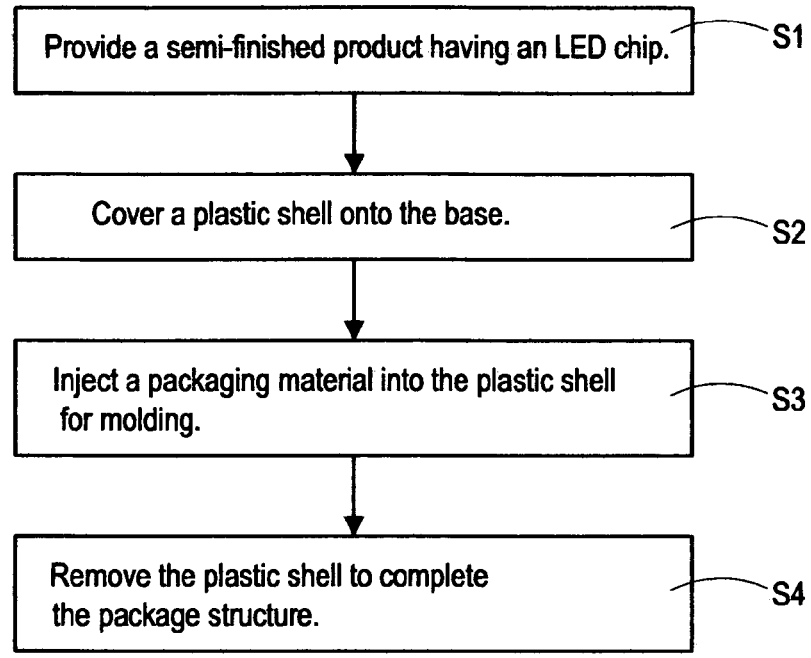
FIG. 7 is a flow chart of a manufacturing method of the invention.

Referring to FIG. 7, the manufacture flow of the LED packaging process comprises the steps of providing a base 1 of the light emitting diode having an installed semi-finished product of an LED chip 2 (S1); covering a plastic shell 3 onto the base 1 and fully sealing the LED chip 2 (S2); injecting a packaging material into an injection hole 31 of the plastic shell 3 for the formation until the plastic shell 3 is filled up with the packaging material 4 (S3); and releasing and removing the mold of the plastic shell 3 to complete the light emitting diode structure, after the packaging material 4 forms a packaging cover 11 (S4).

Figure 8:
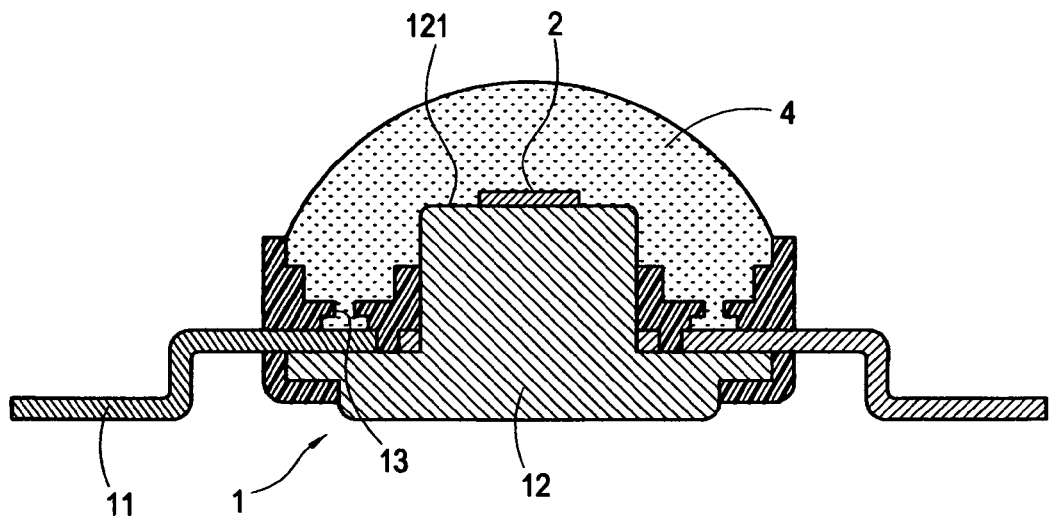
FIG. 8 is a schematic view of another further preferred embodiment of the invention.

Referring to FIG. 8 for another preferred embodiment of the present invention, the base 1 includes an inverted T-shaped groove 13 preinstalled at the bottom and around the periphery of the LED chip 2, such that after the plastic shell 3 fully covers and seals the base 1, and the packaging material 4 is injected through the injection hole 31 on the plastic shell 3, the packaging material 4 also can be injected into the groove 13 around the periphery of the base 1 until the plastic shell 3 is filled up with the packaging material 4 and the package material is solidified to from a packaging cover, and the packaging material 4 filled in the groove 13 is solidified to form an connecting end for securing the packaging cover onto the base 1.

The present invention are illustrated with reference to the preferred embodiment and not intended to limit the patent scope of the present invention. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A method of manufacturing a light emitting diode package structure, comprising the steps of:

providing a light emitting diode semi-finished product containing a chip;

covering a plastic shell onto a light emitting diode base, the plastic shell comprising an injection hole disposed on a lateral side thereof and opposite to the base;

injecting a packaging material from the injection hole into the plastic shell for molding; and removing the plastic shell to complete the package structure, wherein the base includes an inverted T-shaped groove preinstalled at the bottom and around the periphery of the chip, such that after the plastic shell fully covers and seals the base, and the packaging material is injected through the injection hole on the plastic shell, the packaging material is injected into the groove until the plastic shell is filled up with the packaging material and the package material is solidified to from a packaging cover, and the packaging material filled in the groove is solidified to form an connecting end for securing the packaging cover onto the base.

2. The method of manufacturing a light emitting diode package structure of claim 1, wherein the packaging material is a silicone material.

3. The method of manufacturing a light emitting diode package structure of claim 1, wherein the light emitting diode semi-finished product is a lead frame type light emitting diode.

4. The method of manufacturing a light emitting diode package structure of claim 1, wherein the light emitting diode semi-finished product is a printed circuit board type light emitting diode.

5. The method of manufacturing a light emitting diode package structure of claim 1, wherein the light emitting diode base further comprising a heat dissipating member, on which there is a plane for fixing the chip.

6. The method of manufacturing a light emitting diode package structure of claim 1, wherein the plastic shell is in a hemispherical shape for covering the base and sealing the chip in the plastic shell.

7. The method of manufacturing a light emitting diode package structure of claim 1, wherein the plastic shell is installed onto the base to fully seal the space around the periphery of the chip.

8. The method of manufacturing a light emitting diode package structure of claim 2, wherein the hardness of the silicone material falls within a range from shore A40 to shore D70.

* * * * *